United States Patent [19]

Naiff

[11] 4,341,960
[45] Jul. 27, 1982

[54] I²L STATIC SHIFT REGISTER

[75] Inventor: Kenneth L. Naiff, Hauppage, N.Y.

[73] Assignee: General Instrument Corporation, Hicksville, N.Y.

[21] Appl. No.: 123,434

[22] Filed: Feb. 21, 1980

[51] Int. Cl.³ ............................................. G11C 19/28
[52] U.S. Cl. ................................ 307/221 R; 307/459; 307/299 B
[58] Field of Search ................ 307/459, 221 R, 299 B

[56] References Cited

U.S. PATENT DOCUMENTS

| | | | |
|---|---|---|---|
| 3,195,053 | 7/1965 | Jeeves | 307/221 R |
| 3,636,376 | 1/1972 | Hoffmann | 307/221 R |
| 3,851,187 | 11/1974 | Pao et al. | 307/221 R |
| 4,075,508 | 2/1978 | Scott | 307/459 |
| 4,099,263 | 7/1978 | Scott | 307/459 X |
| 4,209,715 | 6/1980 | Aoki | 307/459 X |

Primary Examiner—John S. Heyman
Attorney, Agent, or Firm—James & Franklin

[57] ABSTRACT

Each bit of the register includes a plurality of active elements which perform as NOR logic gates. Each active element comprises an I²L unit consisting of a bipolar inverter transistor and a bipolar injector transistor. Each element is cross-coupled with the previous element and the subsequent element, resulting in the static characteristic of the register. Data transfer control signals are generated which consist of a number of time synchronized pulse trains. Each pulse train is applied to a different one of the active elements in a bit and serves to energize same when positive (high). The shift register is bi-directional. The direction of data transfer is determined solely by the sequence of the data transfer control signals. The register is reset by causing all components of the control signal to simultaneously go low and thereafter restarting same in the proper sequence.

1 Claim, 4 Drawing Figures

I²L STATIC SHIFT REGISTER

BACKGROUND OF THE INVENTION

The present invention relates to shift registers and, more particularly, to a static shift register capable of implementation by I²L techniques.

I²L (integrated-injection logic) is a relatively recent development in bipolar semiconductor fabrication techniques, currently being used in the manufacture of large-scale integrated circuits. With this technique, it is possible to merge regions from different transistors in order to increase circuit density and eliminate previously required transistor interconnections. Moreover, the performance characteristics of I²L circuits can match, or surpass, those of circuits fabricated by other known techniques. For example, I²L circuits are capable of operating faster than N-channel MOS (metal oxide semiconductor) circuits and consuming less power than CMOS (complimentary metal oxide semiconductor) circuits, respectively, the high speed and lower power branches of the MOS family. In the bipolar world, I²L offers a meas to maintain higher bipolar speed as circuits reach, and even surpass, LSI complexities previously promised only by MOS techniques.

The fundamental I²L logic unit comprises an inverter transistor and an injector transistor which acts as a current source for the inverter transistor. The inverter transistor physically consists of a vertical NPN multi-emitter bipolar transistor, operated in the inverse mode. In that mode, the conventional bipolar emitters perform as collectors. Base drive to the NPN inverter is supplied by a lateral PNP bipolar transistor, commonly referred to as an injector. On the chip, certain of the diffused areas of the PNP injector are integrated (merged) with those of the PNP inverter in the bulk silicon.

I²L can be implemented in conventional bipolar epitaxial technology. As a result, integrated circuit chips employing I²L can be fabricated on existing bipolar production lines, thus enabling designers to combine other bipolar technology with I²L logic on the same chip.

The high packing density of I²L results from the simplicity of its merged structure in the bulk silicon. That simplicity manifests itself in several density enhancing features of the chip layout, including a small number of contacts per gate, complete absence of diffused resistors, no wiring within units, and easy routing of wiring between units.

Other advantages of I²L technology include lower source voltage requirements, as compared to MOS technology, immunity to noise and other interference, and the ability to tolerate large power source variations. Moreover, over wide ranges of speed and power dissipation, I²L exhibits a near constant power-delay product.

Because of the above-stated advantages of I²L technology, it is clear to those skilled in the art that circuits partially or completely fabricated by I²L will play a major role in future large-scale integrated circuit fabrication. It is, therefore, necessary for circuit designers to develop basic processing components in I²L technology which perform functions similar to the basic processing components utilized in other technologies. However, because of the different properties of I²L, new circuit designs are required to take full advantage of the attributes of this technology.

One of the commonly used components in a variety of different processing applications is the shift register. A shift register is basically a device which stores data for a given number of time periods, usually represented by clock pulses. The register receives data signals in time sequence at its input. The data signals are retained by shifting or transferring same within the register, one shift normally occurring for each time period. After the given number of time periods, the data signals appear in the same time sequence at the output of the shift register.

A shift register is comprised of a number of bits or stages which determine the storage capacity thereof. The data signals are transferred from one bit to the next in response to data transfer control signals, the timing of which determines the speed at which the data is transferred from one bit to the next.

Broadly considered, shift registers can be divided into two categories, dynamic and static. In a dynamic shift register, a charge representative of data is temporarily stored in an element by means of a capacitor, often the inherent capacitance of the control terminal of a transistor. Charge stored in this manner will, however, dissipate in a relatively short time. In a dynamic shift register, in order to retain the data therein, the frequency of the shifting of the data (number of times per unit time data is transferred from one element in the register to the next) must be high enough to transfer the stored charge before same dissipates. Thus, while extremely useful in certain applications, dynamic shift registers have an inherent disadvantage, that is, the shifting frequency must always be greater than a lower limit determined by the rate of stored charge dissipation. If the shifting frequency should fall below this limit, the data stored in the shift register is unretrievably lost.

A static shift register, on the other hand, has no lower limit of shifting frequency and, therefore, will retain data therein even at a shifting frequency of zero. This may be accomplished by interconnecting the transistors which go to make up the shift register in a feedback relation, such that the charge stored by the capacitance of one register element is continuously reinforced by the output of another element, connected in feedback relationship thereto, thus preventing the dissipation of the charge, even at a shifting frequency of zero. An excellent example of a static shift register implemented in MOS technology which uses this technique is disclosed in U.S. Pat. No. 3,683,203, entitled ELECTRONIC SHIFT REGISTER SYSTEM, granted to Kent F. Smith on August 8, 1972.

Although I²L technology is beginning to find widespread application, only recently have there been attempts to design shift registers employing I²L techniques. Some of these attempts resulted in semidynamic shift registers which rely heavily on process parameters and are therefore difficult and expensive to fabricate. In order to avoid process problems, some designers have attempted to design I²L static shift registers by functionally copying almost directly from the structure of known MOS static shift registers, resulting in large D-type static registers which are overly complex and do not fully take advantage of the known attributes of I²L technology.

It is, therefore, a prime object of the present invention to provide a static shift register which can be implemented in I²L technology.

It is another object of the present invention to provide an I²L shift register which is simple, compact, and easy to design and fabricate.

It is another object of the present invention to provide an I²L shift register wherein each active element thereof is identical to every other active element, facilitating design and fabrication thereof.

It is another object of the present invention to provide an I²L static shift register wherein each active element is of simple design.

It is another object of the present invention to provide an I²L static shift register which is bi-directional.

It is another object of the present invention to provide an I²L static shift register wherein the direction of data transfer is determined solely by the time sequence or order of the components of the data transfer control signal.

It is another object of the present invention to provide an I²L static shift register which functions bi-directionally without the necessity for data transfer direction control lines, required by conventional bi-directional shift registers.

It is another object of the present invention to provide an I²L shift register wherein resetting is achieved simply by simultaneously holding all of the components of the control signal in the low or "off" condition and thereafter re-starting the control signal with the components thereof in the normal time sequence.

It is another object of the present invention to provide an I²L shift register which does not require reset control lines.

It is another object of the present invention to provide an I²L shift register with high density due to the elimination of reset control and data transfer direction control lines, normally required by shift registers having reset and bi-directional capabilities.

It is a further object of the present invention to provide an I²L shift register which can be fabricated on conventional bi-polar processing equipment.

In accordance with the present invention, a shift register is provided comprising a bit. The bit comprises a given number of active elements operably connected in sequence. Each active element includes an I²L unit, operably cross-coupled to an adjacent unit. Means are provided for generating a control signal having a plurality of components, one of which is operably connected to a different one of the active elements in the bit. Each control signal component comprises at least one pulse which is effective, when present, to energize the element to which same is applied, for the duration of the pulse.

The control signal components are generated in a given time sequence of order. The time sequence or order alone determines the direction of data transfer through the register. Thus, a reversal of the time sequence results in a reversal of the direction of data transfer through the bit. No separate data transfer direction control lines to the active elements are required.

Means are provided for resetting the elements. The resetting means comprises means for temporarily deactuating the control signal generating means for a given time period and, thereafter, restarting the control signal generating means. Thus, when the control signal generating means is temporarily deactuated, the shift register is automatically reset. In this manner, no separate reset control lines to the active elements are required.

A control signal component is required for each I²L unit in a bit. Each control signal component comprises a series or train of spaced positive clock pulses. The clock pulses of the control signal components may be nonoverlapping or overlapping, as desired.

Each of the active elements has a data input and a data output. The data input of each element is operably connected to the data output of the previous element. The data output of each element is operably connected to the data input of the previous element. Thus, the data input of each element is operably connected in direct relation to the data output of the previous element and in feedback relation to the output of the subsequent element. Viewed in a different manner, each element is operably cross-coupled with both the previous and subsequent elements. From this cross-coupling technique, the static characteristic of the shift register is derived. Each element comprises a control signal input which is operably connected to the control signal generating means to receive one component of the control signal.

Each element is an I²L unit which includes a bipolar inverter transistor and a bipolar injector transistor. The inverter transistor and the injector transistor are operably connected between the control signal input and ground.

The injector transistor is a bipolar transistor having a base terminal, a collector terminal and an emitter terminal. The base terminal of the injector transistor is connected to ground. The emitter terminal is operably connected to the control signal input. The collector terminal is operably connected to the inverter transistor to provide base drive therefor.

The inverter transistor of each unit is a bipolar transistor having a base terminal, first and second collector terminals and an emitter terminal. The base terminal is operably connected to the injector transistor, and, more particularly, to the collector terminal thereof. The collector terminals of the inverter transistor are operably connected to the previous I²L unit and subsequent I²L unit, respectively. The emitter terminal of the inverter transistor is operably connected to ground.

The base terminal of the inverter transistor is also connected to the data input of the unit. The data input of each unit is connected directly to the data output of the previous unit, without an isolation device interposed therebetween. The elimination of the necessity for an isolation device between units significantly simplifies the structure of the shift register.

Since each unit is identical to every other unit in the register, design, layout and fabrication are simplified and relatively inexpensive. In addition, the elimination of the necessity for isolation devices, data transfer direction control lines and reset control lines reduces the complexity and the size of the bits, thereby permitting a larger number of bits to be fabricated in a given chip area.

To the accomplishment of the above, and to such other objects as may hereinafter appear, the present invention relates to an I²L static shift register as described in the following specification, and set forth in the annexed claims, taken together with the accompanying drawings, wherein like numerals refer to like parts, and in which:

Figure 1:
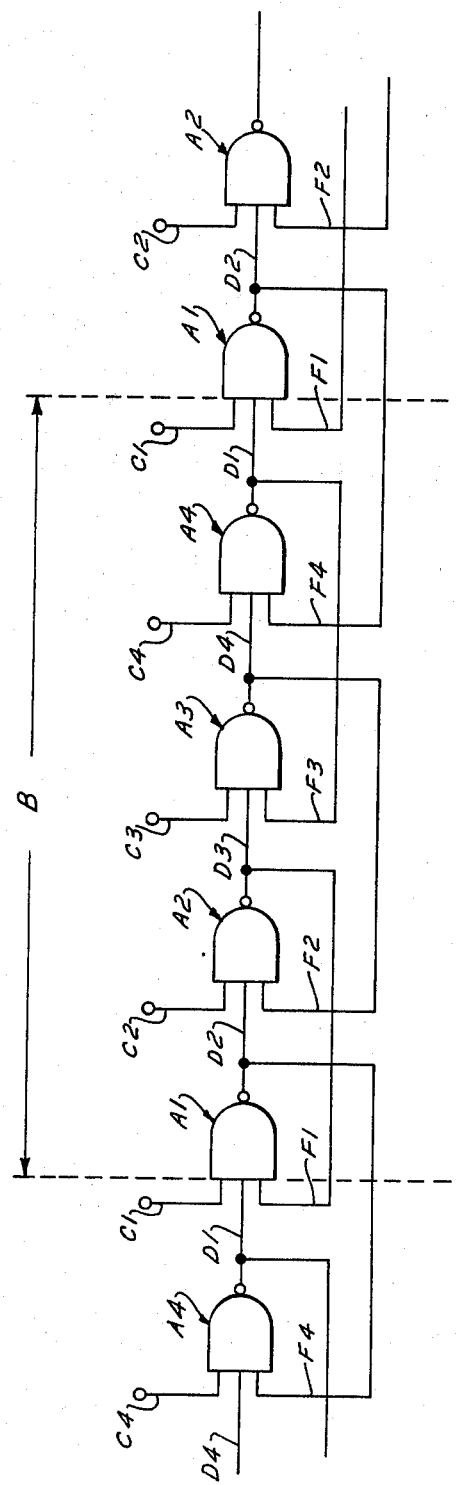
FIG. 1 is a logic diagram of the shift register of the present invention.

As illustrated in FIG. 1, the preferred embodiment of the present invention comprises a shift register having any desired number of bits, each of which is generally designated B. Each bit B comprises four active elements, generally designated $A_1$, $A_2$, $A_3$, and $A_4$, respectively. Each active element A has a control signal input, generally designated $C_1$, $C_2$, $C_3$, $C_4$, respectively, a data input, generally designated $D_1$, $D_2$, $D_3$, $D_4$, respectively, and a feedback input, generally designated $F_1$, $F_2$, $F_3$, $F_4$, respectively. Each active element A is represented in the logic diagram which forms FIG. 1 with a NOR symbol because a logic "1" input appearing on either the data input D, or the feedback input F, or both, will result in the active element generating a logic "0" signal at its output. On the other hand, if both the data input D and the feedback input F are at logic "0", the active element will generate a logic "1" output.

Each active element A is cross-coupled to both the previous and the subsequent active element. Thus, for example, the data output of element $A_2$ is connected to the data input of element $A_3$ and the data input of element $A_1$. The data input of element $A_2$ is connected to the data output of element $A_1$ and to the data output of element $A_3$. It is this cross-coupled configuration which gives the shift register of the present invention its static characteristic.

Figure 2:
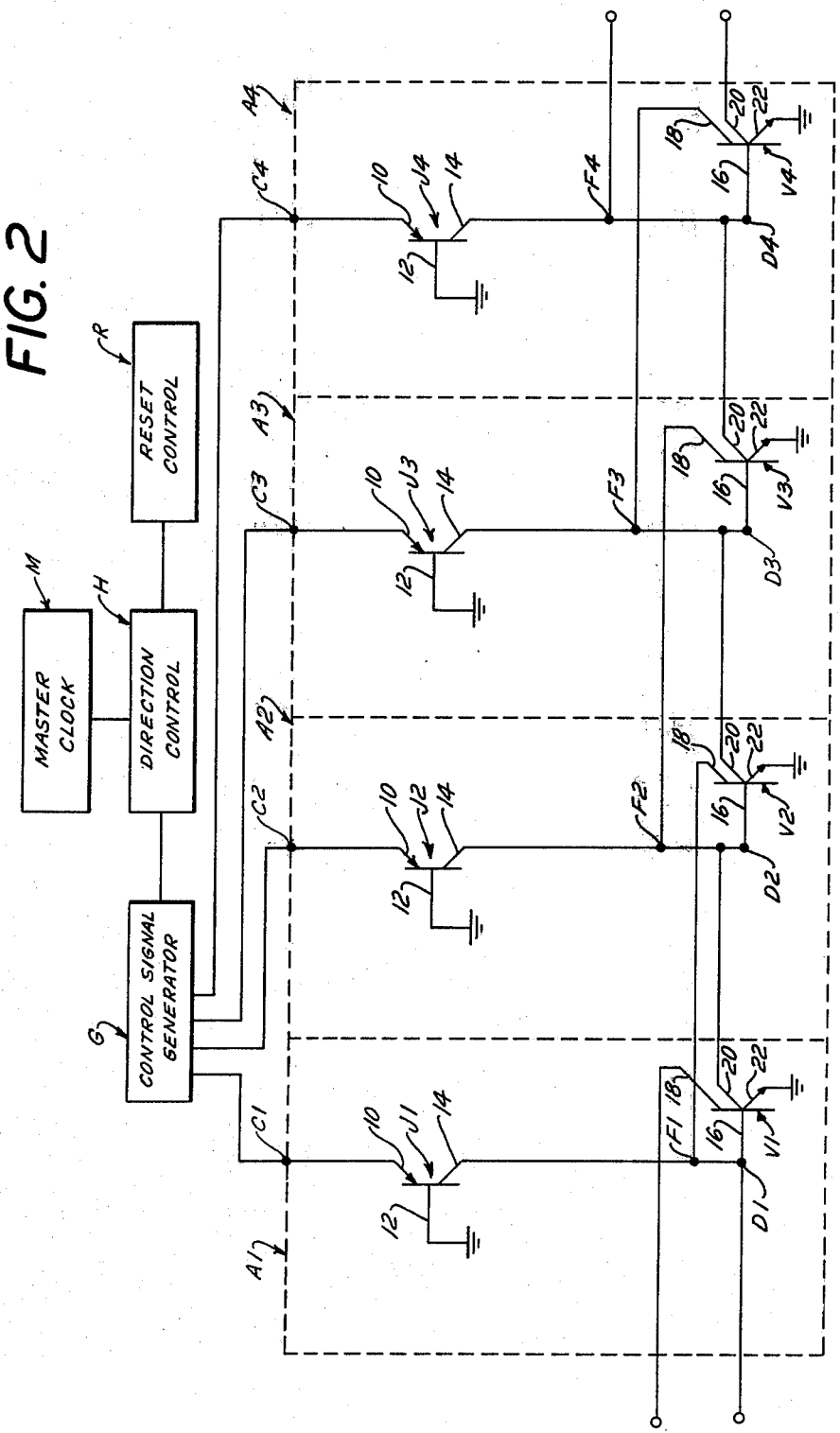
FIG. 2 is a schematic diagram of one bit of the shift register of the present invention.

FIG. 2 schematically illustrates the structure of each of the active elements $A_1$ through $A_4$. Each of the active elements comprises an injector transistor, generally designated $J_1$, $J_2$, $J_3$, $J_4$, respectively, and an inverter transistor, generally designated $V_1$, $V_2$, $V_3$, $V_4$, respectively. Each injector transistor J is a bipolar PNP transistor which acts as a current source to provide base drive to the inverter transistor V connected thereto. Each inverter transistor V is a bipolar NPN multi-emitter transistor operated in the inverse mode. In that mode, the conventional bipolar NPN emitters perform as collectors.

The emitter terminal 10 of each injector transistor J is connected to the control signal input C for the active element A of which the injector forms a part. The control terminal or base 12 of each injector transistor J is connected to a source of given potential, in this case, ground. The collector terminal 14 of each injector transistor J is connected to the control terminal or base 16 of the inverter transistor V which forms a portion of the active element. Base 16 of each of the inverter transistors is connected to the data input D of the active element of which the inverter transistor forms a part.

Each inverter transistor V has two collectors 18 and 20. Each collector terminal 18 is connected to the feedback input F of the previous active element A in sequence. Each collector 20 of each inverter transistor V is connected to the data input D of the subsequent active element A, in sequence. Each inverter transistor V has an emitter terminal 22 which is connected to a source of given potential, in this case ground. Thus, each active element A consists of an injector transistor J and an inverter transistor V which are operably connected between the control signal input and ground. In addition, each active element A is cross-coupled to both the previous active element and the subsequent active element.

Four separate control signal components are required to control data movement through the register. One control signal component is provided for each active element A in a bit B. The four control signal components, designated, $CLK_1$, $CLK_2$, $CLK_3$, $CLK_4$, respectively, are fed to the control signal inputs $C_1$, $C_2$, $C_3$, $C_4$, respectively, from a control signal generator, generally designated G. Control signal generator G may consist of four conventional clock pulse generators, each generating a clock signal CLK, and a means of synchronizing the running of the clock pulse generators in a predetermined time sequence or order. Control signal generator G may alternatively comprise different structures, well known in the art, utilized to generate multiple signals of this type.

As mentioned previously, the direction of data transfer through the shift register is determined solely by the time sequence or order of the control signal components. Thus, if the control signal generator comprises four separate clock pulse generators, the sequence or order of the control signal components can be simply determined by starting each clock signal generator in sequence at times determined in accordance with signals received from a master clock. Thus for instance, clock signal $CLK_1$ could be started at a particular time (e.g., T) determined by a master clock, clock signal $CLK_2$ could be started one unit of time (T+1) after the time determined by the master clock, clock signal $CLK_3$ could be started two units of time (T+2) after the time determined by the master clock, and clock signal $CLK_4$ could be started three units of time (T+3) after the time determined by the master clock. In order to reverse the direction of data flow, the clocks are simply started in the opposite sequence. For example, clock signal $CLK_4$ is begun at the time (T) determined by the master clock, clock signal $CLK_3$ is started one unit of time (T+1) thereafter, clock signal $CLK_2$ is started two units of time (T+2) thereafter and clock signal $CLK_1$ is started three units of time (T+3) thereafter. When the latter sequence is utilized, data will flow through the shift register in a direction which is the reverse of the direction of the flow of the former sequence.

To accomplish this result, a master clock, generally designated M, is provided which is connected to control signal generator G through a direction control circuit, generally designated H. Direction control circuit H determines the sequence in which the four clock pulse generators of control signal generator G are started, in accordance with the output of master clock M.

Also connected as an input to direction control circuit H is a reset control circuit, generally designated R. When reset control circuit R is actuated, direction control circuit H causes each of the clock pulse generators in control signal generator G to stop generating clock pulses for a predetermined time (longer than the delay time of the stored charge) after which direction control circuit H causes the clock pulse generators in control signal generator G to restart in the proper sequence. The result of this is that the entire shift register is automatically reset.

Figure 3:
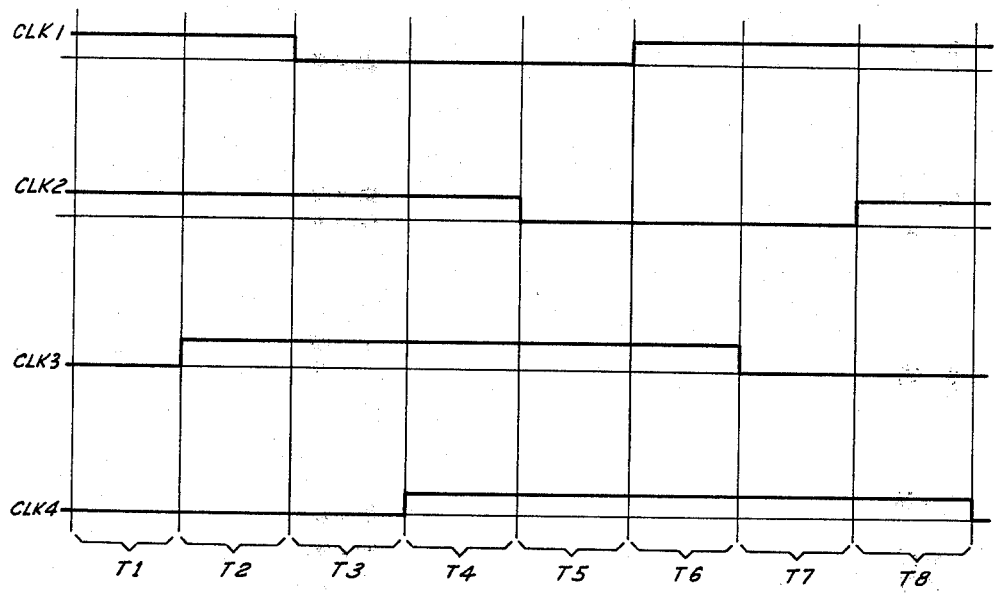
FIG. 3 is a graphical representation of the control signal utilized to cause the shift register of the present invention to shift data in a first (forward) direction; and, FIG. 4 is a graphical representation of the control signal necessary to cause the shift register of the present invention to transfer data in a second (reverse) direction.
Figure 4:
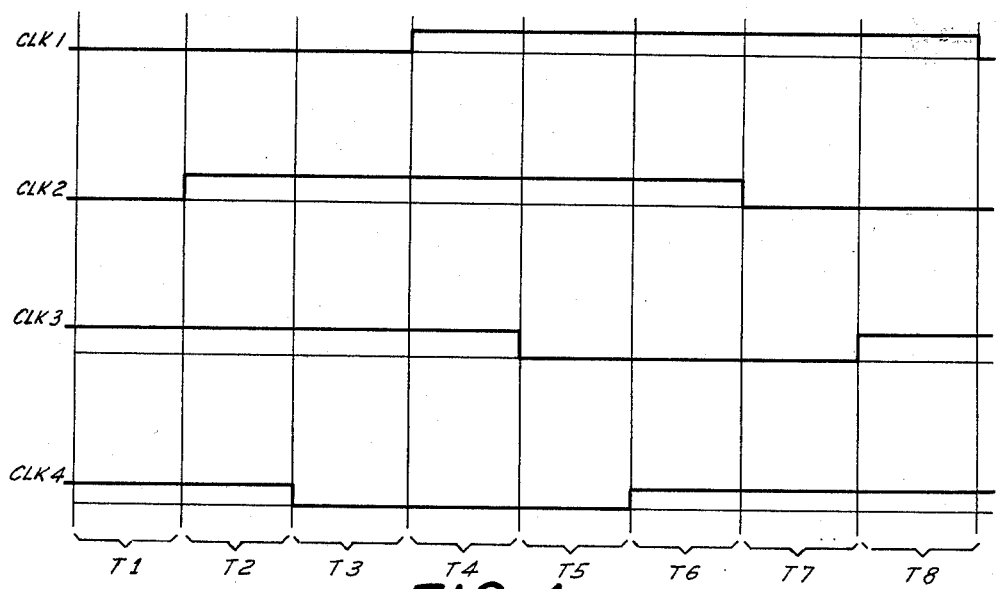

In order to fully appreciate the operation of the shift register of the present invention, it is necessary to consider the nature of the control signal components and the manner in which same cause data to be transferred from one active element to the next within the shift register. For this purpose, graphical representations of two different control signal sequences are shown in FIGS. 3 and 4. The control signal sequence illustrated in FIG. 3 will cause data to be transferred through the shift register in the forward direction (from left to right, as seen in FIGS. 1 and 2). Conversely, the control signal sequence illustrated in FIG. 4 will cause data to be transferred through the shift register in the reverse direction, that is, from the right to the left, as seen in FIGS. 1 and 2.

In each instance, the control signals are shown in eight time slots $T_1$ through $T_8$, respectively, and the signals generated by the four clocks are in overlapping relationship with the signals generated by the other clocks. This form has been chosen for ease of explanation, but it should be understood that the present invention is not to be confined to the particular control signal sequences illustrated, nor should same be considered to be a limitation on the present invention. In fact, other control signal sequences can be utilized, depending upon the intended application of the shift register. For instance, instead of eight time slots, four time slots could be utilized. Further, non-overlapping pulses, instead of overlapping pulses, could be utilized.

Each clock signal generator generates a pulse train which consists of a series of positive (high) pulses, each of which lasts for five time slots, between which are dwell (low) periods of three time slots duration each. In this example, each clock signal generator runs two time slots ahead of the next clock signal generator. For example, if $CLK_1$ becomes high at the beginning of the sixth time slot $T_6$, then $CLK_2$ will become high at the beginning of the eighth time slot $T_8$, $CLK_3$ will become high at the beginning of the second time slot $T_2$ and $CLK_4$ will become high at the beginning of the fourth time slot $T_4$, etc. In the reverse mode, as shown in FIG. 4, the pulse trains are precisely the same as described above, except they are started in the opposite sequence. Thus, if $CLK_4$ becomes high at the beginning of the sixth time slot $T_6$, then $CLK_3$ becomes high at the beginning of the eighth time slot $T_8$, $CLK_2$ becomes high at the beginning of the second time slot $T_2$, and $CLK_1$ becomes high at the beginning of the fourth time slot $T_4$, etc.

The presence of a positive pulse at the control signal input C for an active element A causes same to be energized. The absence of a positive pulse (low state) causes the active element to be de-energized. This is because the base drive for each inverter transistor V is derived from the injector transistor J which acts as a current source therefor. However, the injector transistor J only acts as a current source if a positive potential is applied to its emitter 10. Thus, if a positive pulse is not applied to emitter 10 of the injector transistor of a particular active element A, the entire active element is de-energized and performs no function.

Considering the control sequence shown in FIG. 3, assume, prior to time slot $T_1$, a data signal L (logic "1" or logic "0") is applied to the data input $D_1$ of active element $A_1$. During time slot $T_1$, $CLK_1$ and $CLK_2$ are high, whereas $CLK_3$ and $CLK_4$ are low. Active elements $A_1$ and $A_2$ are therefore energized, whereas active elements $A_3$ and $A_4$ are de-energized. The energization of active element $A_1$ will cause the data signal L to be inverted and appear at the data input $D_2$ of the next active element $A_2$ as $\bar{L}$. For example, if L is a logic "1", inverter transistor $V_1$ will be turned on, causing collector 20 to be grounded through emitter 22. Thus, a logic "0" will appear at data input $D_2$. A logic "0" at data input $D_2$ will maintain inverter transistor $V_2$ in the "off" state, such that a logic "1" signal L will appear at data input $D_3$. Thus, the original data signal L has been twice inverted and again appears as L.

During time slot $T_2$, $CLK_1$, $CLK_2$ remain high, $CLK_3$ becomes high and $CLK_4$ is still low. As $CLK_3$ becomes high, active element $A_3$ is energized and the signal at data input $D_3$ (L) is inverted by inverter $V_3$, such that $\bar{L}$ appears at data input $D_4$ of active element $A_4$. During the third time slot $T_3$, $CLK_1$ becomes low, de-energizing active element $A_1$, erasing any data contained therein, $CLK_2$ and $CLK_3$ remain high and $CLK_4$ remains low. During time slot $T_3$, the data remains as it was during time slot $T_2$ (it does not advance), that is, an L state on data input $D_3$ and an $\bar{L}$ state at data input $D_4$.

During the fourth time slot $D_4$, $CLK_1$ remains low keeping active element $A_1$ in the deenergized state, and clock signals $CLK_2$, $CLK_3$ remain high, and $CLK_4$ becomes high, causing the $\bar{L}$ logic state present at data input $D_4$ to be inverted through inverter transistor $V_4$ and appear as L on collector 20 of inverter $V_4$. Thus, after four time slots, the data has traversed the bit and appears in its original form at the output of the last element in the bit. During the next time slot $T_5$, $CLK_1$ remains low, $CLK_2$ becomes low, and $CLK_3$ and $CLK_4$ remain high. During this time slot, no transfer occurs, L remaining on the output of active element $A_4$ and $\bar{L}$ remaining on the output of active element $A_3$. Active element $A_2$ is, however, deenergized.

During the next time slot $T_6$, $CLK_1$ again becomes high, $CLK_2$ remains low and $CLK_3$ and $CLK_4$ remain high. During this time slot a second data signal S (either logic "1" or logic "0") may be applied to data input $D_1$ for active element $A_1$. Inverter transistor $V_1$ inverts second logic signal S such that $\bar{S}$ appears at data input $D_2$ of active element $A_2$. Logic states $\bar{L}$ and L remain in their previous positions, at the outputs of active elements $A_3$ and $A_4$, respectively. During this time slot the first active element $A_1$ in the next bit (not shown) become energized, thereby inverting L from the output of $A_4$ to form $\bar{L}$ on the input of $A_2$ of the next bit.

During the next time slot $T_7$, $CLK_1$ remains high, $CLK_2$ remains low, $CLK_3$ becomes low and $CLK_4$ remains high. During this time slot, the inverted version $\bar{S}$ of the second logic signal remains at the data input $D_2$ of active element $A_2$. Active element $A_2$ is de-energized so it does not act to re-invert the second data signal at this time. Active element $A_3$ becomes de-energized erasing the data contained therein. The state of the output of active element $A_4$ (L) remains unchanged, as does the state ($\bar{L}$) of the first active element (not shown) in the next bit.

During the next time slot $T_8$, $CLK_1$ remains high, $CLK_2$ becomes high, $CLK_3$ remains low and $CLK_4$ remains high. Thus, the inverted version of the second logic signal $\bar{S}$, applied to data input $D_2$, is now reinverted by inverter transistor $V_2$ and appears as S at data input $D_3$ of active element $A_3$. However, active element $A_3$ is de-energized and thus does not serve to invert the second logic signal applied to its data input $D_3$ at this time. The logic state of active element $A_4$ remains unchanged. The identical operation occurs in the next bit, with the $\bar{L}$ signal at data input $D_2$ being inverted and appearing at L at data input $D_3$. After the completion of time slot $T_8$, the cycle begins again with time slot $T_1$. It will now be apparent the manner in which the control signal causes the transfer of data through the active elements in the shift register in the forward direction.

It is important to understand that the output of each active element is fed back to the input of the previous active element, such that should the frequency of the control signal approach zero, the data contained within the shift register will be preserved (although not shifted). The feedback interconnections act to preserve the data by reinforcing the data input for each energized active element. For instance, the logic signal at the output of active element $A_3$ is fed back to the data input of active element $A_2$ and reinforces the logic signal thereon with the same logic signal as is applied thereto from the output of element $A_1$. The output of active element $A_3$ is the twice inverted version of the logic signal at the output of active element $A_1$. The twice inverted version of a logic signal is the logic signal itself. Thus, the data output of one active element is identical to the data input of the previous active element. Feedback occurs through each collector 18 which is connected to the feedback input F of the previous active element.

In order to reverse the direction of data transfer through the shift register, it is simply necessary to generate the same clock sequence, but in reverse order. The control signals necessary to cause data to be transferred through the shift register in the reverse direction are graphically illustrated in FIG. 4.

During the first time slot $T_1$, $CLK_1$ and $CLK_2$ are low causing active elements $A_1$ and $A_2$ to be de-energized, whereas $CLK_3$ and $CLK_4$ are high indicating that active elements $A_3$ and $A_4$ are energized. Assume during time slot $T_1$ a first logic signal L is applied to the feedback input $F_4$ of active element $A_4$. This signal L will be inverted in an inverter $V_4$ and the inverted result $\bar{L}$ will be applied to feedback input $F_3$ of active element $A_3$. Inverter $V_3$ will invert the logic signal applied to its base 16 resulting in the same logic state L being applied to data input $D_4$ of active element $A_4$, thus reinforcing the feedback input.

During the next time slot $T_2$, $CLK_1$ remains low, $CLK_2$ becomes high and $CLK_3$ and $CLK_4$ remain high. Thus, active element $A_2$ has been energized such that the L logic state applied through feedback input $F_2$ is inverted by inverter $V_2$ and becomes $\bar{L}$ at data input $D_3$ of active element $A_3$, serving to reinforce the input thereof.

During the next time slot $T_3$, $CLK_1$ remains low, $CLK_2$ and $CLK_3$ remain high and $CLK_4$ becomes low, thus de-energizing active element $A_4$. The logic states of active elements $A_2$ and $A_3$ remain unchanged.

During the next time slot $T_4$, $CLK_1$ becomes high, $CLK_2$ and $CLK_3$ remain high and $CLK_4$ remains low. Thus, during this time slot, the active element $A_1$ becomes energized, such that the logic signal $\bar{L}$ applied thereto through feedback input $F_1$ from the output of active element $A_2$ is inverted by inverter $V_1$ and appears as logic state L at data input $D_2$.

During the next time slot $T_5$, $CLK_1$ and $CLK_2$ remain high, $CLK_3$ becomes low and $CLK_4$ remains low. Thus, active elements $A_3$ and $A_4$ are de-energized and active elements $A_1$ and $A_2$ remain energized with the logic states unchanged.

During the next time slot $T_6$, $CLK_1$ and $CLK_2$ are high, $CLK_3$ remains low and $CLK_4$ becomes high, energizing active element $A_4$ which now receives a second logic signal S at its feedback input $F_4$. S is inverted in inverter $V_4$ and thus a logic state $\bar{S}$ appears at feedback input $F_3$ of active element $A_3$. The logic states of active elements $A_1$ and $A_2$ remain unchanged. The logic state L is transferred to the active element $A_4$ in the preceeding bit.

During the next time slot $T_7$, $CLK_1$ remains high, $CLK_2$ becomes low, $CLK_3$ remains low and $CLK_4$ remains high. Thus, the active element $A_2$ is de-energized, but no data is transferred.

On the next time slot $T_8$, $CLK_1$ remains high, $CLK_2$ remains low, $CLK_3$ becomes high and $CLK_4$ remains high. Thus, active element $A_3$ is energized causing the second logic signal $\bar{S}$ to again be inverted and appear as an S state at the feedback input $F_2$ of active element $A_2$. In addition, the logic state of the first logic signal is transferred from element $A_4$ to element $A_3$ of the preceeding bit. It will now be appreciated that by simply reversing the sequence of the clock signals, data can be caused to be transferred in the reverse direction within the shift register.

The present invention, therefore, relates to a static shift register which can be implemented in $I^2L$ technology and utilizes simply constructed identical $I^2L$ units as active elements. The shift register is bi-directional and the direction of data flow is determined solely by the time sequence of the components of the control signal applied thereto. Thus, no external data transfer direction control lines are required. In addition, resetting of the shift register is accomplished simply by causing all the control signal components to become low simultaneously and thereafter restarting the control signal sequence. No isolation devices are required between the active elements of the shift register. The elimination of the necessity of isolation devices, data transfer direction control lines and reset control lines results in a simplified structure permitting greater density per unit area of chip.

While only a single preferred embodiment of the present invention has been described herein for purposes of illustration, it is obvious that many modifications and variations could be made thereto. It is intended to cover all of these variations and modifications which fall within the scope of the present invention, as defined by the following claims:

I claim:

1. An $I^2L$ shift register comprising a bit, said bit comprising a given number of units operably interconnected in sequence, each unit comprising a control input, a data input, a data output, a feedback output, an injector transistor having a collector, a base and an emitter and an inverter transistor having a base, first and second collectors and an emitter, said emitter of said injector transistor being operably connected to said control input, said base of said injector being operably connected to ground, said collector of said injector transistor being operably connected to said base of said inverter transistor, said base of said inverter transistor being operably connected to the data output from the previous unit and the feedback output from the subsequent unit, said first and second collectors of said inverter transistor being operably connected to said data output and feedback output, respectively, and means for generating a series of control signals, one for each unit in the bit, said generating means having separate outputs, each of which is operably connected to said control input of a different one of said units in the bit, said register further comprising control reset means operably connected to said control signal generating means for causing said control signal generating means to temporarily cease generating control signals for a time longer than the decay time of the charge on said bases of said inverter transistors thereby automatically resetting said shift register.

* * * * *